United States Patent
Yoo

Patent Number: 6,151,264
Date of Patent: Nov. 21, 2000

[54] INTEGRATED CIRCUIT MEMORY DEVICES INCLUDING A SINGLE DATA SHIFT BLOCK BETWEEN FIRST AND SECOND MEMORY BANKS

[75] Inventor: Jei-hwan Yoo, Kyungki-do, Rep. of Korea

[73] Assignee: Samsung Electronics Co., Ltd., Rep. of Korea

[21] Appl. No.: 09/280,026

[22] Filed: Mar. 26, 1999

[30] Foreign Application Priority Data

Nov. 9, 1998 [KR] Rep. of Korea .................. 98-47831

[51] Int. Cl.[7] ..................................................... G11C 8/00
[52] U.S. Cl. ...................... 365/230.03; 365/194; 365/221
[58] Field of Search .................. 365/230.03, 194, 365/63, 221

[56] References Cited

U.S. PATENT DOCUMENTS

| | | | |
|---|---|---|---|
| 5,254,883 | 10/1993 | Horowitz et al. | 307/443 |
| 5,473,575 | 12/1995 | Farmwald et al. | 365/230.06 |
| 5,578,940 | 11/1996 | Dillon et al. | 326/30 |
| 5,606,717 | 2/1997 | Farmwald et al. | 395/856 |
| 5,663,661 | 9/1997 | Dillon et al. | 326/30 |
| 5,898,623 | 4/1999 | Clinton et al. | 365/230.03 |
| 5,901,103 | 5/1999 | Harris, II et al. | 365/230.03 |

OTHER PUBLICATIONS

U.S. application No. 09/137,543, Yoon, filed Aug. 20, 1998.
U.S. application No. 09/207,534, Moon et al., filed Dec. 8, 1998.

*Primary Examiner*—Son T. Dinh
*Attorney, Agent, or Firm*—Myers Bigel Sibley & Sajovec

[57] ABSTRACT

Integrated circuit memory devices include first and second spaced-apart memory banks in an integrated circuit substrate. A pad block in the integrated circuit substrate is located between the first and second spaced-apart memory banks. An input/output block in the integrated circuit substrate is connected to the pad block to receive input data from external of the integrated circuit memory device via the pad block and to transmit output data to external of the integrated circuit memory device via the pad block. A delay locked loop in the integrated circuit substrate is responsive to an external clock signal to generate an internal clock signal. An interface logic block in the integrated circuit substrate is responsive to the internal clock signal to control the first and second memory banks and the input/output block in response to the internal clock signal. A single data shift block in the integrated circuit substrate is located between the pad block and one of the first and second spaced-apart memory banks. The single data shift block is connected to the input/output block by a first plurality of lines and to both of the first and second memory banks by a second plurality of lines that is an integer multiple of the first plurality. The single data shift block converts serial data on the first plurality of lines to parallel data on the second plurality of lines and converts parallel data on the second plurality of lines to serial data on the first plurality of lines. The invention may be used in any integrated circuit memory device. However, the invention is preferably used in a packet type integrated circuit memory device that operates on packets of data address and control signals, such as a Rambus integrated circuit memory device.

20 Claims, 2 Drawing Sheets

INTEGRATED CIRCUIT MEMORY DEVICES INCLUDING A SINGLE DATA SHIFT BLOCK BETWEEN FIRST AND SECOND MEMORY BANKS

FIELD OF THE INVENTION

This invention relates to integrated circuit memory devices and more particularly to integrated circuit memory devices including data shift blocks.

BACKGROUND OF THE INVENTION

Electronic systems that use a high level of data bandwidth, such as in multimedia applications, may need memory devices that provide the necessary rate of data transfer and other advantages. One technology that may provide the necessary bandwidth is the Rambus technology marketed by Rambus, Inc. of Mountain View, Calif. The Rambus technology is described in U.S. Pat. No. 5,473,575 to Farmwald et al., U.S. Pat. No. 5,578,940 to Dillion et al., U.S. Pat. No. 5,606,717 to Farmwald et al. and U.S. Pat. No. 5,663,661 to Dillion et al. A device embodying the Rambus technology is an example of a packet type integrated circuit memory device, because each integrated circuit receives data and addresses in packet units in a normal mode of operation. The packet is received by the Rambus device which generates internal control signals, internal data signals, and internal address signals to carry out the corresponding operation of the packet. For example, the packet may include data, address, and control signals for a write operation.

FIG. 1 is a block diagram of a layout of internal circuits in a conventional Rambus integrated circuit memory device. As shown in FIG. 1, a conventional Rambus integrated circuit memory device 101 includes first and second memory banks 111 and 121, first and second core interfaces 113 and 123, first and second data shift blocks 131 and 141, interface logic block 151, first and second input/output units 161 and 162, a delay locked loop 163 and a pad block 171 that are arranged in an integrated circuit substrate.

As also shown in FIG. 1, the first core interface 113; the first data shift block 131; the interface logic 151; the combination of the first input/output unit 161, the delay locked loop 163 and the second input/output unit 162; the pad block 171; the second data shift block 141; and the second core interface 123 are serially arranged in the integrated circuit substrate along a first direction between the first and second memory banks 111 and 121. The first and second memory banks are selected by a bank selection signal BS.

A power supply voltage and a ground voltage are supplied to the first and second data shift blocks 131 and 141 via the pad block 171 from external of the integrated circuit memory device 101. Unfortunately, since the first data shift block 131 is remote from the pad block 171, the supply voltage and ground voltage that are supplied to the first data shift block may be prone to noise.

The delay locked loop 163 is responsive to an external clock signal CLK that is received from the pad block 171 to generate an internal clock signal SCLK. The delay locked loop provides the internal clock signal SCLK to the first and second data shift blocks 131 and 141 and to the interface logic block 151.

The interface logic block 151 is responsive to the internal clock signal to control the first and second memory banks 111 and 121 and the input/output units 161 and 162 in response to the internal clock signal.

The first data shift block 131 is connected between the first and second input/output units 161 and 162 and the first memory bank 111. The second data shift block 141 is connected between the first and second input/output units 161 and 162 and the second memory bank 121. The first and second data shift blocks 131 and 141 convert serial data from the input/output portions 161 and 162 into parallel data that is provided to the associated memory bank 111 or 121 and also convert parallel data that is received from the associated memory bank 111 or 121 into serial data that is provided to the first and second input/output units 161 and 162, respectively. Accordingly, the two data shift blocks 131 and 141 can facilitate signal connection to the internal circuits that are included in the Rambus integrated circuit memory device 101.

As packet type integrated circuit memory devices continue to be used in data processing systems, it is desirable to reduce the size of the packet type integrated circuit memory device. Moreover, it is also desirable to decrease the power consumption of the device and increase the performance thereof.

SUMMARY OF THE INVENTION

It is therefore an object of the present invention to provide integrated circuit memory device layouts that can have reduced size in an integrated circuit substrate.

It is another object of the present invention to provide packet type integrated circuit memory device layouts that can have reduced size in an integrated circuit substrate.

It is yet another object of the present invention to provide integrated circuit memory devices, including packet type integrated circuit memory devices, which can have reduced power consumption.

It is still another object of the present invention to provide integrated circuit memory devices, including packet type integrated circuit memory devices, which can have improved performance.

These and other objects are provided, according to the present invention, by combining the first and second data shift blocks into a single data shift block that is located between the pad block and one of the first and second spaced-apart memory banks. The single data shift block is connected to the input/output block by a first plurality of lines and to both of the first and second memory banks by a second plurality of lines that is an integer multiple of the first plurality.

By providing a single data shift block between the pad block and one of the first and second spaced-apart memory banks, the distance between the single data shift block and the pad block may be reduced to thereby allow reduced noise on the power supply and/or ground lines. Moreover, by combining the first and second data shift blocks into a single data shift block, the size of the integrated circuit may be reduced. Finally, the use of a single data shift block can reduce loading on the internal clock signal that is provided to the data shift block. The power consumption by the delay locked loop due to loading of the internal clock output thereof can thereby be reduced to thereby allow reduction in the power consumption of the integrated circuit memory device. Accordingly, reduced size and/or reduced power consumption and/or improved performance may be obtained.

Integrated circuit memory devices according to the present invention include an integrated circuit substrate and first and second spaced-apart memory banks in the integrated circuit substrate. A pad block in the integrated circuit substrate is located between the first and second spaced-apart memory banks. An input/output block in the integrated circuit substrate is connected to the pad block to receive input data from external of the integrated circuit memory device via the pad block and to transmit output data to external of the integrated circuit memory device via the pad block. A delay locked loop in the integrated circuit substrate is responsive to an external clock signal to generate an internal clock signal. An interface logic block in the integrated circuit substrate is responsive to the internal clock signal to control the first and second memory banks and the input/output block in response to the internal clock signal.

A single data shift block in the integrated circuit substrate is located between the pad block and one of the first and second spaced-apart memory banks. The single data shift block is connected to the input/output block by a first plurality of lines and to both of the first and second memory banks by a second plurality of lines that is an integer multiple of the first plurality. The single data shift block converts serial data on the first plurality of lines to parallel data on the second plurality of lines and converts parallel data on the second plurality of lines to serial data on the first plurality of lines, under control of the interface logic block.

In a preferred embodiment, the input/output block comprises first and second input/output units, and the delay locked loop is located between the first and second input/output units. The interface logic block also is preferably located between the pad block and the other of the first and second spaced-apart memory banks.

The present invention may be used in any integrated circuit memory device. However, the present invention is preferably used in a packet type integrated circuit memory device that operates on packets of data address and control signals, such as a Rambus integrated circuit memory device. A conventional packet type integrated circuit memory device may be rearranged by combining the first and second data shift blocks into a single data shift block that is located between the pad block and one of the first and second spaced-apart memory banks.

A preferred embodiment of the present invention includes first and second input/output units in the integrated circuit substrate between the first and second spaced-apart memory banks, that are connected to the pad block to receive input data from external of the integrated circuit memory device via the pad block and to transmit output data to external of the integrated circuit memory device via the pad block. A single data shift block is located between the pad block and one of the first and second spaced-apart memory banks. The single data shift block is connected to the first input/output unit by a first plurality of lines, to the second input/output unit by a second plurality of lines, to the first memory bank by a third plurality of lines and to the second memory bank by a fourth plurality of lines, wherein the third plurality is an integer multiple of the first plurality and the fourth plurality is an integer multiple of the second plurality. The first and second plurality preferably are equal, and the third and fourth plurality preferably are equal.

In this embodiment, the single data shift block converts serial data on the first plurality of lines that is received from the first input/output unit into parallel data that is transmitted to the first memory bank on the third plurality of lines or to the second memory bank on the fourth plurality of lines, and converts serial data on the second plurality of lines that is received from the second input/output unit into parallel data that is transmitted to the first memory bank on the third plurality of lines or to the second memory bank on the fourth plurality of lines. The single data shift block also preferably converts parallel data on the third plurality of lines that is received from the first memory bank into serial data that is transmitted to the first input/output unit on the first plurality of lines or to the second input/output unit on the second plurality of lines, and converts parallel data on the fourth plurality of lines that is received from the second memory bank into serial data that is transmitted to the first input/output unit on the first plurality of lines or to the second input/output unit on the second plurality of lines.

Accordingly, a first memory bank, an interface logic block, first and second output units, a pad block, a data shift block and second memory bank preferably are serially arranged in an integrated circuit substrate in a first direction. The first and second input/output units are spaced-apart from one another along a second direction that is orthogonal to the first direction, with a delay locked loop therebetween. The integrated circuit substrate is free of a data shift block between the pad block and the first memory bank. Reduced size and/or reduced power consumption and/or improved performance thereby may be provided.

DETAILED DESCRIPTION OF PREFERRED EMBODIMENTS

Figure 1:
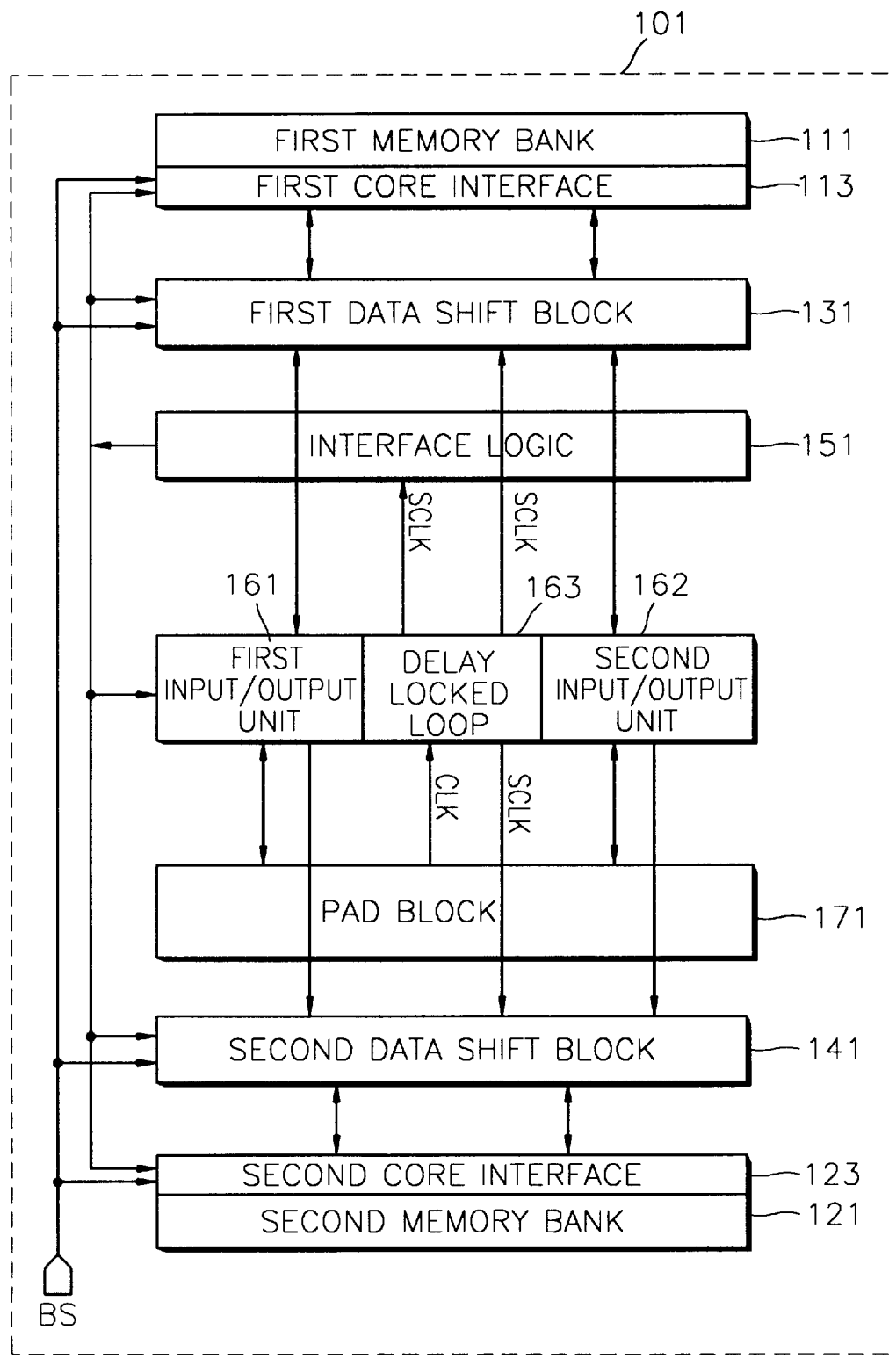
FIG. 1 is a block diagram illustrating an arrangement of internal circuits in a conventional Rambus integrated circuit memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2:
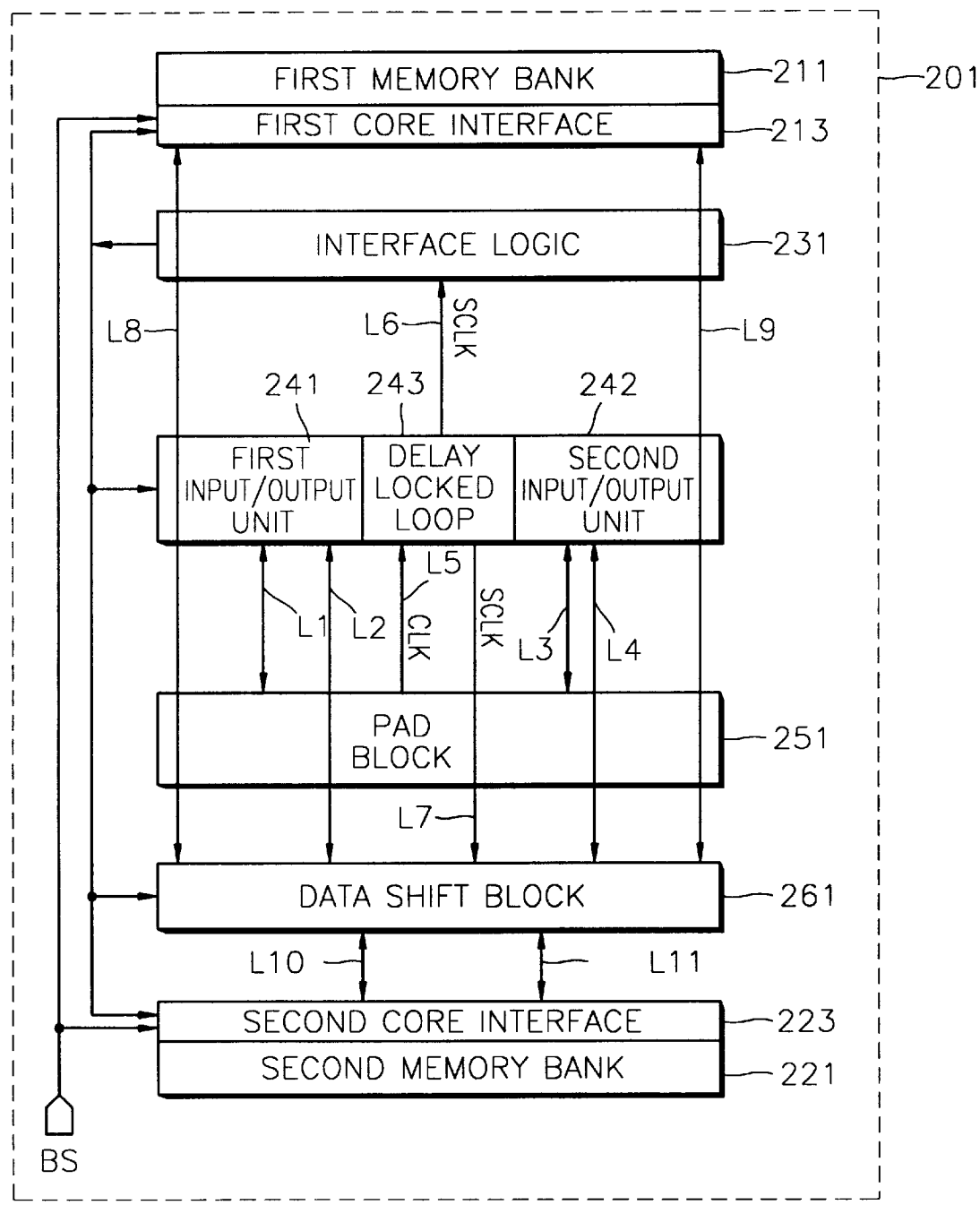
FIG. 2 is a block diagram illustrating internal circuits in an integrated circuit memory device such as a Rambus integrated circuit memory device according to the present invention.

Referring now to FIG. 2, an integrated circuit memory device such as a Rambus Dynamic Random Access Memory (DRAM) device 201 includes first and second memory banks 211 and 221, first and second core interfaces 213 and 223, an interface logic block 231, an input/output block comprising first and second input/output units 241 and 242, a delay locked loop 243, a pad block 251, and a data shift block 261. FIG. 2 shows a serial arrangement of the first memory bank 211; the first core interface 213; the interface logic 231; the first input/output unit 241, the delay locked loop 243, and the second input/output unit 242; the pad block 251; the data shift block 261; the second core interface 223; and the second memory bank 221, along a first direction, here vertical. As also shown, the first input/output unit 241, the delay locked loop 243 and the second input/output unit 242 are also serially arranged along a second direction that is orthogonal to the first direction, here horizontal. It will be understood that these elements can be arranged along different axes and the sequential arrangement between elements can be varied, as long as a single data shift block 261 is provided between the pad block 251 and one of the first and second memory banks 211 and 221.

The first and second core interfaces 213 and 223 are included in the first and second memory banks 211 and 221, respectively. The first and second core interfaces 213 and 223 are selectively operated by a bank selection signal BS. The first and second core interfaces 213 and 223 are controlled by the interface logic 231 to store data transmitted from the data shift block 261 in the first and second memory banks 211 and 221, and to read data stored in the first and second memory banks 211 and 221 and transmit the read data to the data shift block 261.

The first and second input/output units 241 and 242 collectively form an input/output block. The first input/output unit 241 includes a plurality of input receivers and output generators at an input port, and a plurality of output drivers at an output port. Data applied to the pad block 251 is input to the input receivers of the first input/output unit 241 via a conductive line (e.g., metal) group L1 comprised of m (m=1, 2, 3, ...) conductive lines. The data is converted to a voltage level appropriate for the Rambus integrated circuit memory device 201, e.g., a Complementary Metal Oxide Semiconductor (CMOS) level, by the first input/output unit 241. The resultant data is driven by the output drivers of the first input/output unit 241, and transmitted to the data shift block 261 via a first conductive line group L2 comprised of a plurality of conductive lines.

The first input/output unit 241 receives data from the data shift block 261 via the first conductive line group L2, and converts the voltage level of the received data to a voltage level appropriate for an external system connected to the pad block 251. The data converted to the level appropriate for the external system is driven by the output generators of the first input/output unit 241 and transmitted to the pad block 251 via the conductive line group L1.

The second input/output unit 242 supplies and receives data to and from the pad block 251 via a conductive line group L3 comprised of m conductive lines, and also supplies and receives data to and from the data shift block 261 via a second conductive line group L4 comprised of a plurality of conductive lines. The operation of the second input/output unit 242 is similar to that of the first input/output unit 241, so it will not be described again.

The delay locked loop 243 is disposed between the first and second input/output units 241 and 242. The delay locked loop 243 is connected to the pad block 251, the interface logic block 231, and the data shift block 261 respectively via conductive lines L5, L6 and L7. The delay locked loop 243 receives the external clock signal CLK from the pad block 251 via the conductive line L5, stabilizes the frequency of the external clock signal CLK, and generates an internal clock signal SCLK. The internal clock signal SCLK is provided to the interface logic 231 and the data shift block 261 respectively via the conductive lines L6 and L7.

The data shift block 261 operates in synchronization with the internal clock signal SCLK. The data shift block 261 is arranged adjacent the pad block 251. The short distance between the data shift block 261 and the pad block 251 can reduce noise generated in the external supply voltage and ground voltage that is applied to the data shift block 261 via the pad block 251.

The data shift block 261 applies and receives data to and from the first or second memory bank 211 or 221 via the third through sixth conductive line groups L8 through L11, each comprised of conductive lines that are n (n=2, 3, 4, ...) times the plurality of conductive lines constituting the first or second conductive line group L2 or L4. Stated differently, the third through sixth conductive line groups L8 through L11 are an integer multiple of the first or second conductive line group L2 or L4. For example, the data shift block 261 may separate eight data items transmitted in series from the first input/output unit 241 via the first conductive line group L2 comprised of two conductive lines, and may simultaneously transmit the separated data in parallel respectively to the first and second memory banks 211 and 221 via the third and fourth conductive line groups L8 and L10 each comprised of eight metal lines. In this example, the integer multiple is 4. Also, the data shift block 261 integrates the eight data items simultaneously transmitted in parallel from the first and second memory banks 211 and 221 via the third and fourth conductive line groups L8 and L10, and transmits the result to the first input/output unit 241 via the first conductive line group L2 in series.

In the same way, the data shift block 261 separates eight data items transmitted in series from the second input/output unit 242 via the second conductive line group L4 comprised, for example, of two conductive lines, and simultaneously transmits the separated data in parallel respectively to the first and second memory banks 211 and 221 via the fifth and sixth conductive line groups L9 and L11. Also, the data shift block 261 may integrate the eight data items simultaneously transmitted in parallel from the first and second memory banks 211 and 221 via the fifth and sixth conductive line groups L9 and L11, and transmit the result to the second input/output unit 242 via the second conductive line group L4 in series. It will be understood that multiple groups of conductive lines L2, L4, and L8 through L11 also may be provided.

The interface logic block 231 controls the first and second input/output units 241 and 242, the data shift block 261, and the first and second memory banks 211 and 221, in synchronization with the internal clock signal SCLK.

A Rambus integrated circuit memory device 201 according to a preferred embodiment of the present invention is rearranged by combining the first and second data shift blocks 131 and 141 into a single data shift block 261. A Rambus integrated circuit memory device 201 can function similar to a conventional Rambus integrated circuit memory device 101 by arranging the single data shift block 261 as shown in FIG. 2. However, the area of a Rambus integrated circuit memory device 201 according to the present invention may be reduced by 15% or more compared to a conventional Rambus integrated circuit memory device 101 having two data shift blocks, since it has only one data shift block 261.

The use of one data shift block 261 also can reduce power consumption due to the internal clock signal SCLK and the data shift block 261 by one half compared to when two data shift blocks are used. Also, since the data shift block 261 is relatively close to the pad block 251, the length of conductive lines for transmitting a supply voltage and a ground voltage from the pad block 251 to the data shift block 261 may be reduced. Therefore, less noise may be generated on the supply voltage and the ground voltage.

The structure shown in FIG. 2 may be applied to any type of integrated circuit memory device. It may be particularly useful in a ball grid array integrated circuit where a plurality of pads are placed in the center of an integrated circuit chip.

As described above, by combining the first and second data shift blocks into a single data shift block, the area of a Rambus integrated circuit memory device 201 according to the present invention may be reduced. Power consumption due to the internal clock signal SCLK and the data shift block 261 also may be reduced, and the supply voltage noise and the ground voltage noise also may be reduced.

The present invention has been described referring to an embodiment shown in the drawing. However, the embodiment only illustrates one example of the present invention. It will be understood by those skilled in the art that various modifications and other embodiments may be provided. For example, FIG. 2 only described the case when the first memory bank 211, the interface logic 231, the first input/output unit 241, the delay locked loop 243, and the second input/output unit 242, the pad block 251, the data shift block 261, and the second memory bank 221 are serially arranged along the vertical axis. However, when the pad block 251 is located between the first and second memory banks 211 and 221 and the data shift block 261 and the pad block 251 are adjacent one another, the interface logic 231, the first input/output unit 241, the delay locked loop 243, and the second input/output unit 242 may be arranged at any location between the first and second memory banks 211 and 221 or outside the first and second memory banks 211 and 221. Accordingly, integrated circuit memory devices can have reduced area and/or reduced power consumption and/or improved performance.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   an integrated circuit substrate;
   first and second spaced-apart memory banks in the integrated circuit substrate;
   a pad block in the integrated circuit substrate between the first and second spaced-apart memory banks;
   an input/output block in the integrated circuit substrate that is coupled to the pad block to receive input data from external of the integrated circuit memory device via the pad block and to transmit output data to external of the integrated circuit memory device via the pad block;
   a delay locked loop in the integrated circuit substrate that is responsive to an external clock signal to generate an internal clock signal;
   an interface logic block in the integrated circuit substrate that is responsive to the internal clock signal to control the first and second memory banks and the input/output block in response to the internal clock signal; and
   a single data shift block in the integrated circuit substrate that is located between the pad block and one of the first and second spaced-apart memory banks, that is coupled to the input/output block by a first plurality of lines and to both of the first and second memory banks by a second plurality of lines that is an integer multiple of the first plurality, and that is controlled by the interface logic block.

2. An integrated circuit memory device according to claim 1 wherein the input/output block comprises first and second input/output units, and wherein the delay locked loop is located between the first and second input/output units.

3. An integrated circuit memory device according to claim 1 wherein the interface logic block is located between the pad block and the other of the first and second spaced-apart memory banks.

4. An integrated circuit memory device according to claim 1 wherein the single data shift block converts serial data on the first plurality of lines to parallel data on the second plurality of lines and converts parallel data on the second plurality of lines to serial data on the first plurality of lines.

5. An integrated circuit memory device according to claim 1 wherein the integrated circuit memory device is a packet type integrated circuit memory device that operates on packets of data, address and control signals.

6. An integrated circuit memory device according to claim 1 wherein the integrated circuit memory device is a Rambus integrated circuit memory device.

7. An integrated circuit memory device comprising:
   an integrated circuit substrate;
   first and second spaced-apart memory banks in the integrated circuit substrate;
   a pad block in the integrated circuit substrate between the first and second spaced-apart memory banks;
   first and second input/output units in the integrated circuit substrate between the first and second spaced-apart memory banks, that are coupled to the pad block to receive input data from external of the integrated circuit memory device via the pad block and to transmit output data to external of the integrated circuit memory device via the pad block;
   a delay locked loop in the integrated circuit substrate between the first and second spaced-apart memory banks, that is responsive to an external clock signal to generate an internal clock signal;
   an interface logic block in the integrated circuit substrate between the first and second spaced-apart memory banks that is responsive to the internal clock signal to control the first and second memory banks and the input/output block in response to the internal clock signal; and
   a single data shift block in the integrated circuit substrate that is located between the pad block and one of the first and second spaced-apart memory banks, that is coupled to the first input/output unit by a first plurality of lines, to the second input/output unit by a second plurality of lines and to the first memory bank by a third plurality of lines and to the second memory bank by a fourth plurality of lines, and that is controlled by the interface logic block, wherein the third plurality is an integer multiple of the first plurality and the fourth plurality is an integer multiple of the second plurality.

8. An integrated circuit memory device according to claim 7 wherein the delay locked loop is located between the first and second input/output units.

9. An integrated circuit memory device according to claim 7 wherein the interface logic block is located between the pad block and the other of the first and second spaced-apart memory banks.

10. An integrated circuit memory device according to claim 7 wherein the single data shift block converts serial data on the first plurality of lines that is received from the first input/output unit into parallel data that is transmitted to the first memory bank on the third plurality of lines or to the second memory bank on the fourth plurality of lines, and converts serial data on the second plurality of lines that is received from the second input/output unit into parallel data that is transmitted to the first memory bank on the third plurality of lines or to the second memory bank on the fourth plurality of lines.

11. An integrated circuit memory device according to claim 10 wherein the single data shift block converts parallel data on the third plurality of lines that is received from the first memory bank into serial data that is transmitted to the first input/output unit on the first plurality of lines or to the second input/output unit on the second plurality of lines, and converts parallel data on the fourth plurality of lines that is received from the second memory bank into serial data that is transmitted to the first input/output unit on the first plurality of lines or to the second input/output unit on the second plurality of lines.

12. An integrated circuit memory device according to claim 7 wherein the integrated circuit memory device is a packet type integrated circuit memory device that operates on packets of data, address and control signals.

13. An integrated circuit memory device according to claim 7 wherein the integrated circuit memory device is a Rambus integrated circuit memory device.

14. An integrated circuit memory device comprising:
   a first memory bank, an interface logic block, first and second input output units, a pad block, a data shift block and a second memory bank that are serially arranged in an integrated circuit substrate in a first direction, the first and second input/output units being spaced-apart from one another along a second direction that is orthogonal to the first direction, with a delay locked loop therebetween, the integrated circuit substrate being free of a data shift block between the pad block and the first memory bank;
   wherein the input/output block is connected to the pad block to receive input data from external of the integrated circuit memory device via the pad block and to transmit output data to external of the integrated circuit memory device via the pad block;
   wherein the delay locked loop is responsive to an external clock signal to generate an internal clock signal;
   wherein the interface logic block is responsive to the internal clock signal to control the first and second memory banks, the input/output block and the data shift block in response to the internal clock signal; and
   wherein the data shift block is connected to the input/output block by a first plurality of lines and to both of the first and second memory banks by a second plurality of lines that is an integer multiple of the first plurality.

15. An integrated circuit memory device according to claim 14 wherein the data shift block converts serial data on the first plurality of lines to parallel data on the second plurality of lines and converts parallel data on the second plurality of lines to serial data on the first plurality of lines.

16. An integrated circuit memory device according to claim 14 wherein the integrated circuit memory device is a packet type integrated circuit memory device that operates on packets of data, address and control signals.

17. An integrated circuit memory device according to claim 14 wherein the integrated circuit memory device is a Rambus integrated circuit memory device.

18. A method of arranging an integrated circuit memory device in an integrated circuit substrate, the integrated circuit memory device comprising first and second spaced-apart memory banks, a pad block between the first and second spaced-apart memory banks, an input/output block that is connected to the pad block to receive input data from external of the integrated circuit memory device via the pad block and to transmit output data to external of the integrated circuit memory device via the pad block, a delay locked loop that is responsive to an external clock signal to generate an internal clock signal, an interface logic block that is responsive to the internal clock signal to control the first and second memory banks and the input/output block in response to the internal clock signal and first and second data shift blocks, a respective one of which is located between the pad block and a respective one of the first and second memory banks, the method comprising the step of:
   combining the first and second data shift blocks into a single data shift block that is located between the pad block and one of the first and second spaced-apart memory banks, that is connected to the input/output block by a first plurality of lines and to both of the first and second memory banks by a second plurality of lines that is an integer multiple of the first plurality.

19. A method according to claim 18 wherein the single data shift block converts serial data on the first plurality of lines to parallel data on the second plurality of lines and converts parallel data on the second plurality of lines to serial data on the first plurality of lines, and that is controlled by the interface logic block.

20. A method according to claim 18 wherein the integrated circuit memory device is a packet type integrated circuit memory device that operates on packets of data, address and control signals.

* * * * *